(12) United States Patent
Wada et al.

(10) Patent No.: US 7,482,896 B2
(45) Date of Patent: Jan. 27, 2009

(54) SURFACE ACOUSTIC WAVE APPARATUS

(75) Inventors: Koichi Wada, Yokohama (JP); Seiichi Mitobe, Yokohama (JP); Shogo Inoue, Kawasaki (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 264 days.

(21) Appl. No.: 11/367,555

(22) Filed: Mar. 6, 2006

(65) Prior Publication Data

US 2007/0046400 A1  Mar. 1, 2007

(30) Foreign Application Priority Data

Aug. 23, 2005  (JP)  ............... 2005-241195

(51) Int. Cl.
  *H03H 9/145*  (2006.01)
  *H03H 9/25*  (2006.01)
  *H03H 9/64*  (2006.01)
(52) U.S. Cl. ................. 333/196; 310/313 C; 310/313 D
(58) Field of Classification Search ................. 333/196; 310/313 C
See application file for complete search history.

(56) References Cited

U.S. PATENT DOCUMENTS

| | | | | |
|---|---|---|---|---|
| 4,005,378 A | * | 1/1977 | Slobodnik et al. | 333/196 |
| 4,023,124 A | * | 5/1977 | Parker et al. | 333/196 |
| 4,205,285 A | * | 5/1980 | Dempsey et al. | 333/194 |
| 4,458,221 A | * | 7/1984 | Suzuki | 333/196 |
| 4,673,901 A | * | 6/1987 | Ehrmann-Falkenau et al. | 333/196 |
| 4,684,907 A | * | 8/1987 | Zibis | 333/196 |
| 2004/0247153 A1 | * | 12/2004 | Ruile et al. | 381/431 |

FOREIGN PATENT DOCUMENTS

| | | | | |
|---|---|---|---|---|
| CA | 1 033 049 | | 6/1978 | |
| DE | 101 35 871 | | 2/1986 | |
| EP | 0 179 459 | | 4/1986 | |
| EP | 0 188 263 A1 | * | 7/1986 | |
| EP | 0 204 168 | | 12/1986 | |
| JP | 60-041304 | * | 3/1985 | ............ 331/116 R |
| JP | 62-200814 | * | 9/1987 | ............ 310/313 R |

(Continued)

OTHER PUBLICATIONS

Hohkawa et al.; Surface Acoustic Wave Filters Without Apodization Loss; Electronics and Communications in Japan, vol. 62-A; No. 2, 1979; XP002177352.

*Primary Examiner*—Barbara Summons
(74) *Attorney, Agent, or Firm*—Arent Fox LLP

(57) ABSTRACT

A surface acoustic wave apparatus has a configuration by which the spurious of the higher-order transverse modes is suppressed and a SAW excitation intensity distribution is not changed in the propagation direction. The surface acoustic wave apparatus has at least one interdigital transducer; a region with the plurality of interleaved comb-shaped electrodes is formed with two regions which are a first overlapping region and a second overlapping region with overlapping-lengths weighted along a propagation direction of a surface acoustic wave; the first overlapping region and the second overlapping region are in contact or overlapped in a direction vertical to the propagation direction of the surface acoustic wave; and in either the first or the second overlapping region, an overlapping-length weighting envelope curve has at least two or more changing points in the propagation direction of the surface acoustic wave.

17 Claims, 13 Drawing Sheets

FOREIGN PATENT DOCUMENTS

| | | |
|---|---|---|
| JP | 63-26016 | 2/1988 |
| JP | 7-22898 | 1/1995 |
| JP | 7-28195 | 3/1995 |
| JP | 9-270667 | 10/1997 |
| JP | 10-327041 | 12/1998 |

\* cited by examiner

FIG. 2 -- PRIOR ART --

SURFACE ACOUSTIC WAVE APPARATUS

CROSS-REFERENCE TO RELATED APPLICATIONS

This application is based upon and claims the benefit of priority from the prior Japanese Patent Application No. 2005-241195, filed on Aug. 23, 2005, the entire contents of which are incorporated herein by reference.

BACKGROUND OF THE INVENTION

1. Field of the Invention

The present invention relates generally to a surface acoustic wave (SAW) apparatus. More particularly, the present invention relates to a surface acoustic wave filter (SAW resonator filter) configured as a resonator filter using a surface acoustic wave resonator (SAW resonator) or resonator having resonant characteristics in VHF and UHF bands.

2. Description of the Related Art

Recently, SAW devices are widely used in the telecommunications sector. Especially, SAW resonators or SAW resonator filters (hereinafter, referred to as SAW resonator devices) can be miniaturized and have lower loss and used a lot in mobile phones, remote keyless entry systems of automobiles and the like.

The SAW resonator device is constituted by at least one interdigital transducer (IDT) electrode disposed on a piezoelectric substrate and reflectors typically provided on both sides thereof. In the SAW resonator device, energy is confined between the reflectors by reflecting SAW propagated on the piezoelectric substrate through excitation of the IDT. On this occasion, a main propagation mode is a basic mode of modes distributing the energy vertically to the propagation direction of the SAW (hereinafter, referred to as transverse modes). On the other hand, second- or higher-order transverse modes also exist and, although electric charges excited by oscillations of even-order modes are canceled out, electric charges due to odd-order mode are not cancelled out and appear in resonator characteristics as spurious responses.

This spurious due to the higher-order transverse modes exerts a harmful influence as an oscillating-frequency skip phenomenon in an oscillation circuit in the case of the SAW resonator or an in-band ripple in the SAW resonator filter. The higher-order transverse modes are generated because an excitation intensity distribution of the SAW is in a rectangular shape.

FIG. 1 shows how the spurious is generated due to the higher-order transverse modes, using an example of a one-port SAW resonator with one (1) IDT 1 disposed between a pair of reflectors 2a, 2b. Although only a basic transverse mode 10a and a third-order transverse mode 10b are shown in the figure, fifth-, seventh- and higher-order transverse modes exist depending on an aperture length of the IDT.

In order to take a countermeasure for the spurious of the higher-order transverse modes, as shown in FIG. 2, it is known that the excitation intensity distribution 10 of the SAW is matched or approximated with the basic transverse mode 10a to suppress the higher-order transverse modes by using a COS function as overlapping-length weighting envelope curves to perform weighting for overlapping portions where a plurality of comb-shaped electrodes 1c connected to common electrodes 1a, 1b are interleaved (see., e.g., Japanese Examined Patent Application Publication No. 7-28195, Japanese Patent Application Laid-Open Publication Nos. 9-270667 and 7-22898).

In conventional examples, when the overlapping-length weighting envelope curves are looked along the direction of the surface acoustic wave, although the overlapping-length is gradually increased, the overlapping-length takes a downward turn at a certain changing point. This changing point exists as only one point.

The overlapping-length weighting envelope curves are mirror symmetry relative to an axis which is the propagation direction of the surface acoustic wave. Closely examining the symmetric property, for example, in a solid electrode configuration, a difference is generated which corresponds to a distance between adjacent electrode fingers, i.e., a ½ surface acoustic wavelength, however, not only in the solid electrode configuration, the ½ offset in the symmetric property of surface acoustic wavelength due to the electrode configuration is apparent from the structure of a surface acoustic wave apparatus, is not an essential portion of the present invention, and thus is not mentioned later while descriptions are made using the overlapping-length weighting envelope curves.

However, as shown in FIG. 2, if overlapping portions of comb-shaped electrodes 1c is weighted by a COS function as an overlapping-length weighting envelope curves, a distribution 11 is changed which is along the propagation direction of the overlapping-length of the comb-shaped electrodes of an IDT 1 and therefore, an excitation intensity distribution 10 of the SAW is also changed in the propagation direction.

Especially, the SAW resonator filter is affected significantly because the filter characteristics are achieved using a mode with a distribution in the propagation direction (longitudinal mode).

In the case of an IDT electrodes with uniform overlapping-length [normal(non-apodized) IDT electrodes], although a desired characteristic, for example, a bandwidth or an attenuation amount in a desired frequency can be achieved, spurious is generated due to the transverse mode. If the IDT electrodes are weighted by a COS function, although the spurious can be suppressed, a desired characteristic cannot be achieved very frequently.

SUMMARY OF THE INVENTION

It is therefore an object of the present invention to provide a surface acoustic wave apparatus which has a configuration for suppressing the spurious of the higher-order transverse modes and for not changing a SAW excitation intensity distribution in the propagation direction.

In order to achieve the above object, according to an aspect of the present invention there is provided a surface acoustic wave apparatus comprising at least one interdigital transducer, the interdigital transducer disposed such that a plurality of comb-shaped electrodes respectively connected to a pair of common electrodes are interleaved, wherein a region with the plurality of interleaved comb-shaped electrodes is formed with two regions which are a first overlapping region and a second overlapping region with overlapping-lengths weighted along a propagation direction of a surface acoustic wave, wherein the first overlapping region and the second overlapping region are in contact or overlapped in a direction vertical to the propagation direction of the surface acoustic wave, and wherein in either the first or the second overlapping region, an overlapping-length weighting envelope curve has at least two or more changing points in the propagation direction of the surface acoustic wave.

In order to achieve the above object, according to another aspect of the present invention there is provided a surface acoustic wave apparatus comprising at least one interdigital transducer, the interdigital transducer disposed such that a plurality of comb-shaped electrodes respectively connected to a pair of common electrodes are interleaved, wherein a region with the plurality of interleaved comb-shaped electrodes is formed with two regions which are a first overlapping region and a second overlapping region with overlapping-lengths weighted along the propagation direction of the surface acoustic wave, wherein the first overlapping region and the second overlapping region are in contact or overlapped in a direction vertical to the propagation direction of the surface acoustic wave, wherein each of overlapping-length weighting envelope curves in the first and the second overlapping regions has only one changing point in the propagation direction of the surface acoustic wave, and wherein the changing points of overlapping-length weighting envelope curves in the first and the second overlapping regions have the same direction in the propagation direction of the surface acoustic wave.

The overlapping-length weighting envelope curve in the second overlapping region may have a shape of an overlapping-length weighting envelope curve in the first overlapping region translated vertically to the propagation direction of the surface acoustic wave. The overlapping-length weighting envelope curve in the second overlapping region may have a shape of an overlapping-length weighting envelope curve in the first overlapping region translated vertically to the propagation direction of the surface acoustic wave as well as translated in the propagation direction. The overlapping-length weighting envelope curve in the second overlapping region may have a shape which is mirror-symmetrical to an overlapping-length weighting envelope curve in the first overlapping region relative to an axis of the propagation direction of the surface acoustic wave. The overlapping-length weighting envelope curve in the second overlapping region may have a shape which is mirror-symmetrical to an overlapping-length weighting envelope curve in the first overlapping region relative to an axis of the propagation direction of the surface acoustic wave and which is translated in the propagation direction. The overlapping-length weighting envelope curve in the first overlapping region and the overlapping-length weighting envelope curve in the second overlapping region may have shapes different from each other. The overlapping-length weighting envelope curve of either the first or the second overlapping region may form a shape represented by a periodic function f(x), assuming that the propagation direction of the surface acoustic wave is a variable x. The size of each of the first overlapping region and the second overlapping region may be set to 50% of the aperture length of the interdigital transducer. The common electrodes may have a shape corresponding to the overlapping-length weighting envelope curves in the first and second overlapping regions.

In comb-shaped electrodes contributable to SAW excitation, the first overlapping region may be defined as a region from an electrode finger end of a comb-shaped electrode whose electrode finger end is closest to a second common electrode among a plurality of comb-shaped electrodes connected to a first common electrode of the pair of common electrodes, to an electrode finger end of a comb-shaped electrode whose electrode finger end is closest to the first common electrode among the plurality of comb-shaped electrodes connected to the first common electrode of the pair of common electrodes, whereas the second overlapping region may be defined as a region from an electrode finger end of a comb-shaped electrode whose electrode finger end is closest to the first common electrode among a plurality of comb-shaped electrodes connected to the second common electrode of the pair of the common electrodes, to an electrode finger end of a comb-shaped electrode whose electrode finger end is closest to the second common electrode among the plurality of comb-shaped electrodes connected to the second common electrode of the pair of common electrodes.

In other words, the first overlapping region may differently be defined in the SAW excitation contributable comb-shaped electrodes as a region from an electrode finger end of a comb-shaped electrode which has a shortest electrode finger to an electrode finger end of a comb-shaped electrode which has a longest electrode finger among a plurality of electrodes connected to a first common electrode, whereas the second overlapping region may be defined as a region from an electrode finger end of a comb-shaped electrode which has a shortest electrode finger to an electrode finger end of a comb-shaped electrode which has a longest electrode finger among a plurality of comb-shaped electrodes connected to a second common electrode.

The above and other features of the present invention will become more apparent from the embodiments of the present invention which will be described hereinbelow with reference to the accompanying drawings.

According to the invention, transverse-mode spurious is suppressed and the same characteristics as those of normal (non-apodized) electrodes are achieved.

DESCRIPTION OF THE PREFERRED EMBODIMENTS

An embodiment of the invention will now be described with reference to the drawings. It is to be appreciated that the embodiment is for the purpose of describing the invention and that the technical scope of the invention is not limited thereto.

Figure 3:
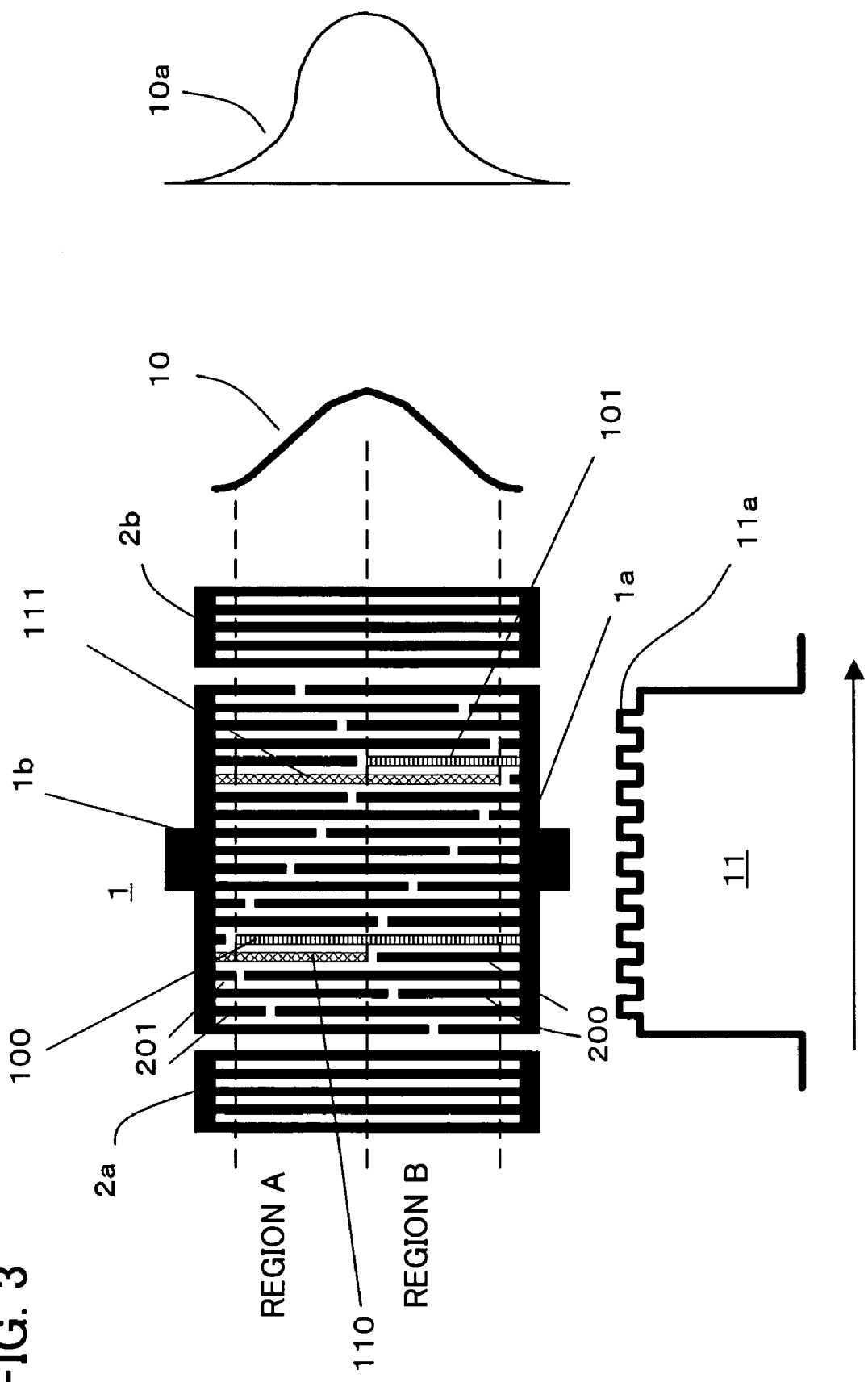
FIG. 3 is a diagram showing an embodiment configuration of the invention.

FIG. 3 is a diagram showing a configuration of an embodiment of the invention.

Figure 1:
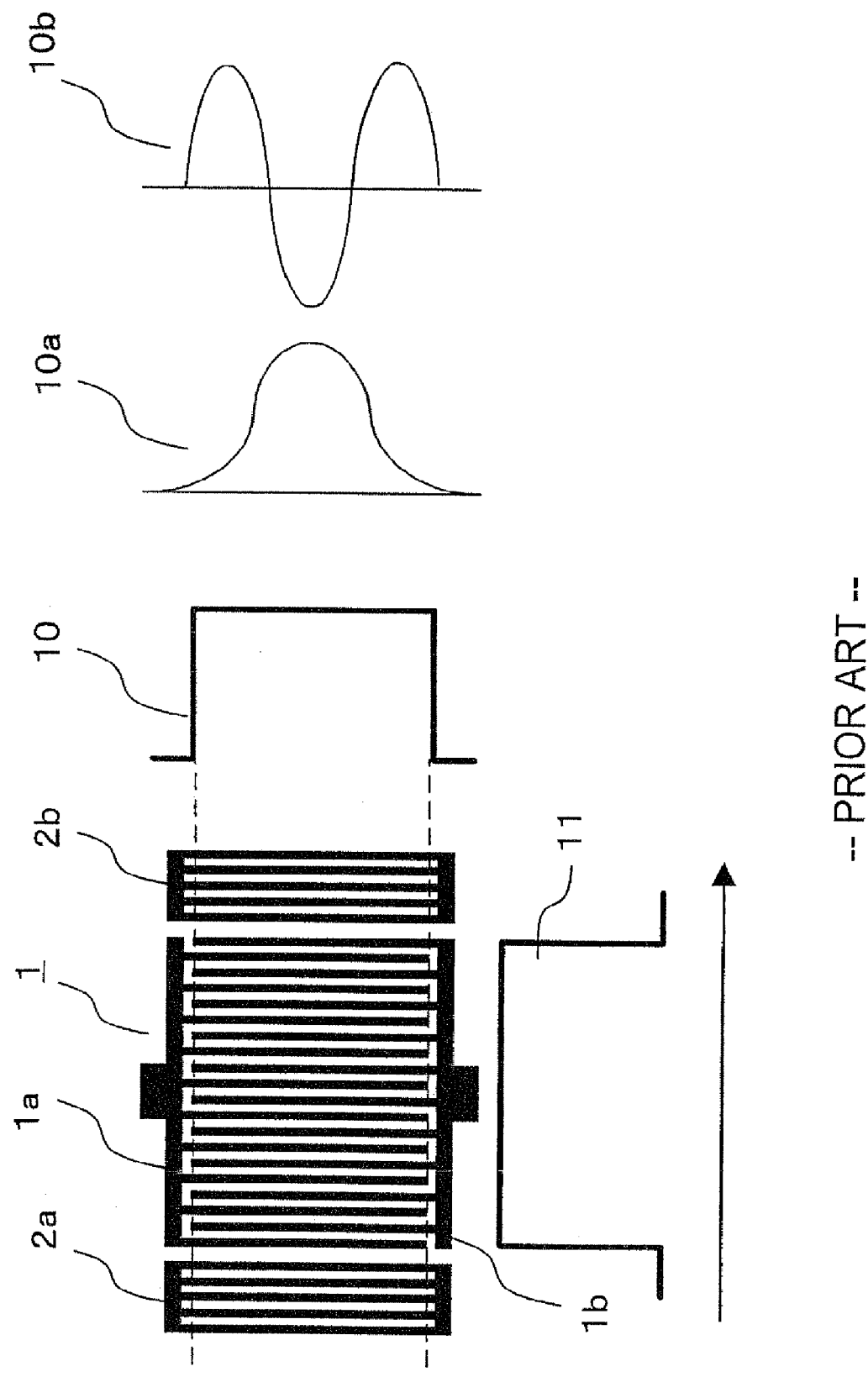
FIG. 1 is a diagram showing an example of a one-port SAW resonator with one IDT disposed between a pair of reflectors.
Figure 2:
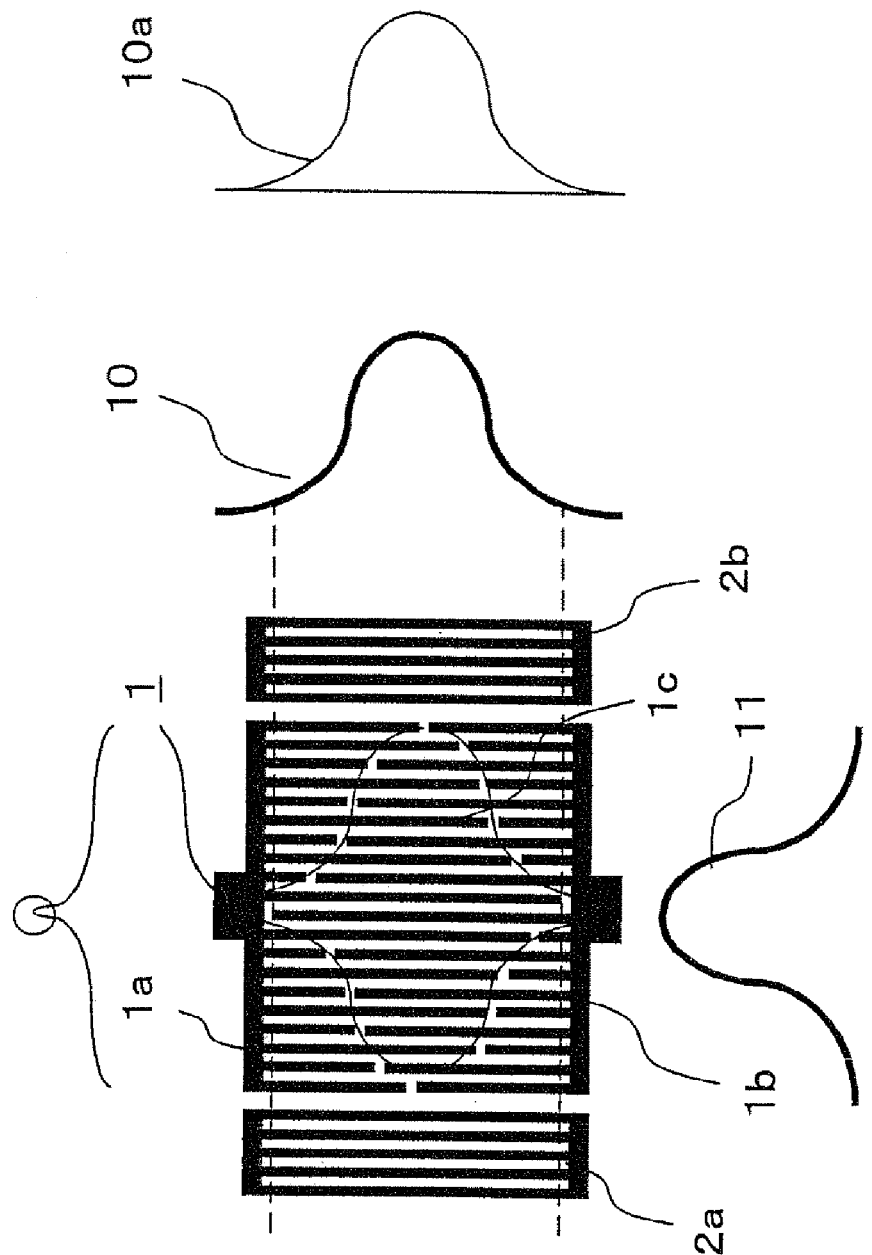
FIG. 2 is a diagram showing a conventional configuration for taking a countermeasure to spurious in higher-order transverse modes.

As shown above in FIG. 1 and FIG. 2, in a surface acoustic wave apparatus with a pair of reflection electrodes 2a, 2b and an interdigital transducer (IDT) 1 disposed between the reflection electrodes 2a, 2b, the reflection electrodes 2a, 2b and the IDT 1 is formed on a piezoelectric substrate not shown, such as $LiTaO_3$, $LiNbO_3$, $Li_2B_4O_7$ and quartz.

As a feature, the IDT 1 is configured by disposing a plurality of comb-shaped electrodes respectively connected to common electrodes (bus bars) 1a, 1b to be interleaved and has a first overlapping region A and a second overlapping region B where the interleaving of the plurality of comb-shaped electrodes is weighted along a propagation direction of a surface acoustic wave (a direction of an arrow of the figure).

A plurality of comb-shaped electrode fingers constituting the IDT1 is connected to the common electrodes (bus bars) 1a, 1b opposite to each other and the electrode fingers having adjacent overlapping portions contribute to the surface acoustic wave excitation.

The first overlapping region A and the second overlapping region B can be defined from the relationship of the comb-shaped electrodes contributing to such surface acoustic wave excitation.

In FIG. 3, the first overlapping region A is a region from an electrode finger end of a comb-shaped electrode 100 which has an electrode finger end closest to the second common electrode 1b side among drive electrodes connected to the first common electrode (bus bar) 1a of a pair of the common electrodes, to an electrode finger end of a comb-shaped electrode 101 which has an electrode finger end closest to the first common electrode 1a side among a plurality of comb-shaped electrodes connected to the first common electrode 1a of the pair of the common electrodes.

On the other hand, the second overlapping region B is a region from an electrode finger end of a comb-shaped electrode 111 which has an electrode finger end closest to the first common electrode 1a side among a plurality of comb-shaped electrodes connected to the second common electrode 1b of the pair of the common electrodes, to an electrode finger end of a comb-shaped electrode 110 which has an electrode finger end closest to the second common electrode 1b side among a plurality of comb-shaped electrodes connected to the second common electrode 1b of the pair of the common electrodes.

In the overlapping regions A and B (hereinafter, referred to as weighted overlapping regions A and B), weighting is performed such that the excitation intensity is gradually reduced toward outside in the direction vertical to the surface acoustic wave (SAW) propagation of the IDT 1.

Therefore, when combining the overlapping region A and the overlapping region B, the excitation intensity distribution of the surface acoustic wave is in a shape 10 approximate to a basic transverse mode 10a. In this way, only the basic transverse mode 10a is generated and higher-order transverse modes are suppressed.

Figure 4:
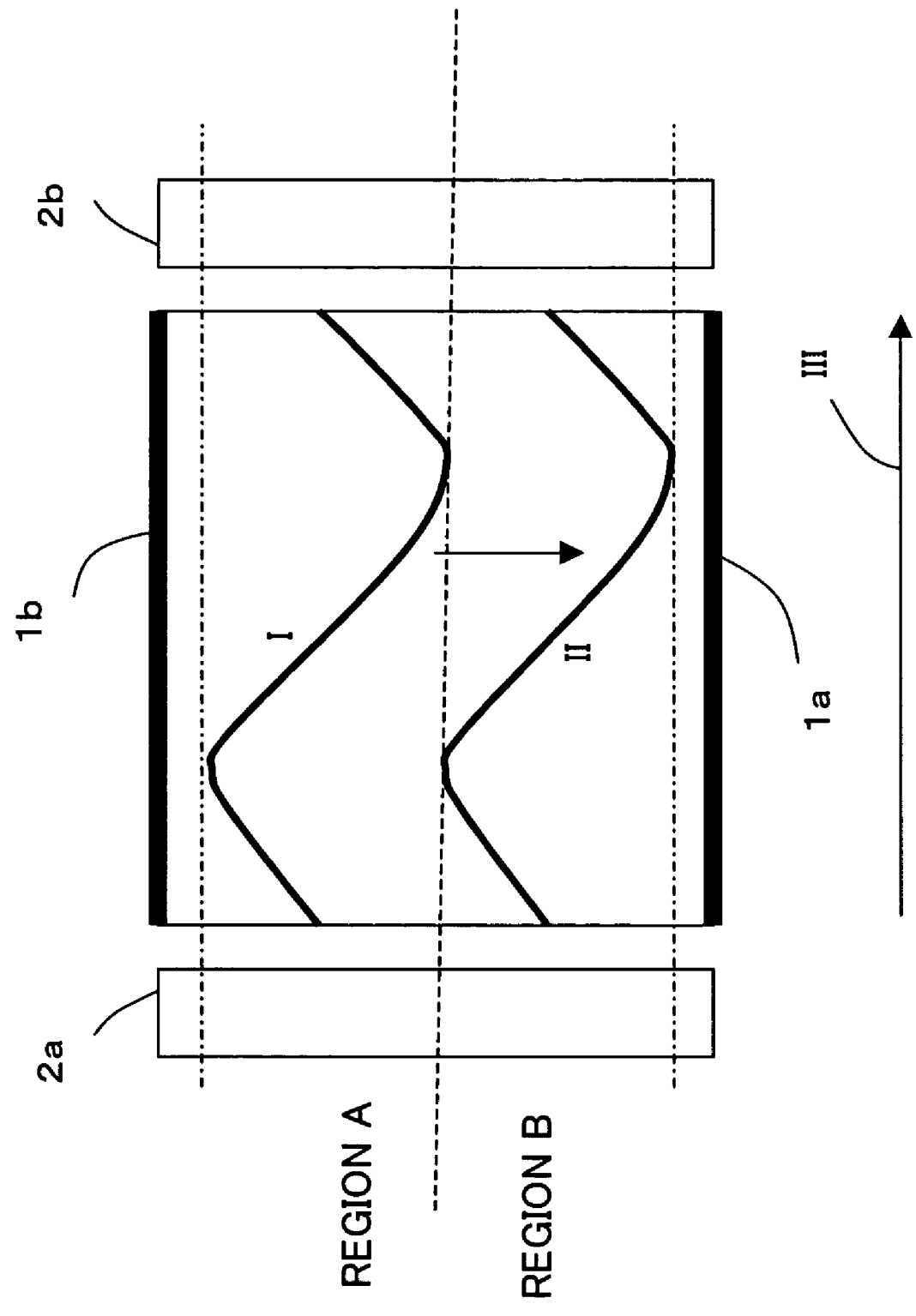
FIG. 4 is a diagram for describing weighting changes in the overlapping regions A and B approximated to envelope curves.

On the other hand, as shown in FIG. 4, the weighting changes in the overlapping regions A and B can be approximated to envelope curves I, II. Therefore, the overlapping-length weighting envelope curve II in the second overlapping region B has a shape of the overlapping-length weighting envelope curve I in the first overlapping region A translated in the direction vertical to the propagation direction (an arrow III of the figure) of the surface acoustic wave.

Although the overlapping-lengths of the electrode fingers, i.e., sizes of overlapping (crossing) portions 11a are uneven between adjacent overlapping-lengths, since the difference in the unevenness is generally small relative to the overlapping-length of the overlapping region A, a distribution 11 is maintained in an almost rectangular shape along the propagation direction of the overlapping-lengths.

As a result, the excitation intensity is maintained in a rectangular shape approximate to the normal (non-apodized) IDT in the arrow direction III, i.e., the propagation direction of the surface acoustic wave.

As described above, according to the invention, the spurious due to the higher-order transverse modes is suppressed and the same characteristics as the normal (non-apodized) electrodes can be achieved.

Figure 5:
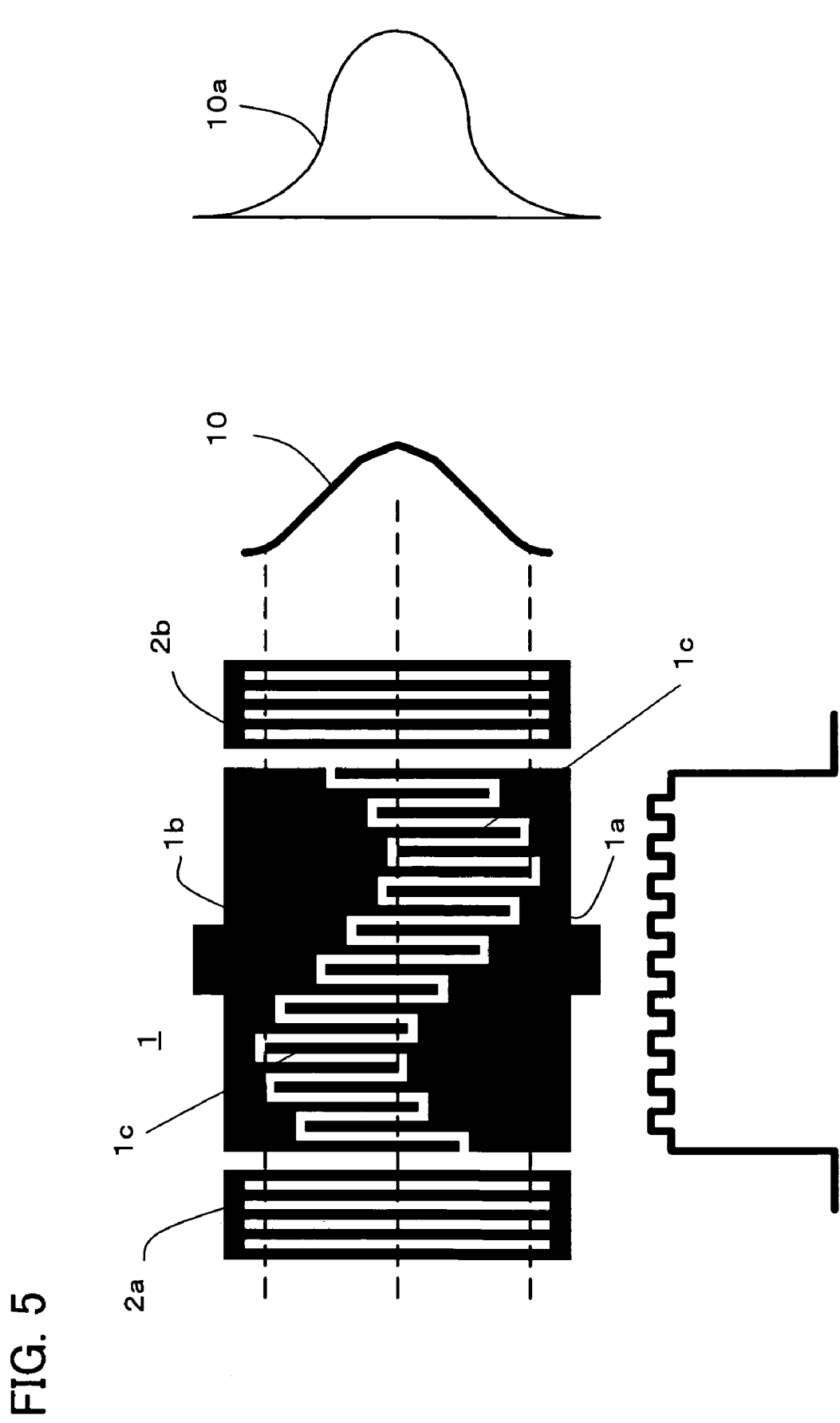
FIG. 5 is a diagram showing an example that the common electrodes (bus bars) itself are set to have a solid pattern shape corresponding to weighting of overlapping amounts of comb-shaped electrodes in weighted overlapping regions.
Figure 6:
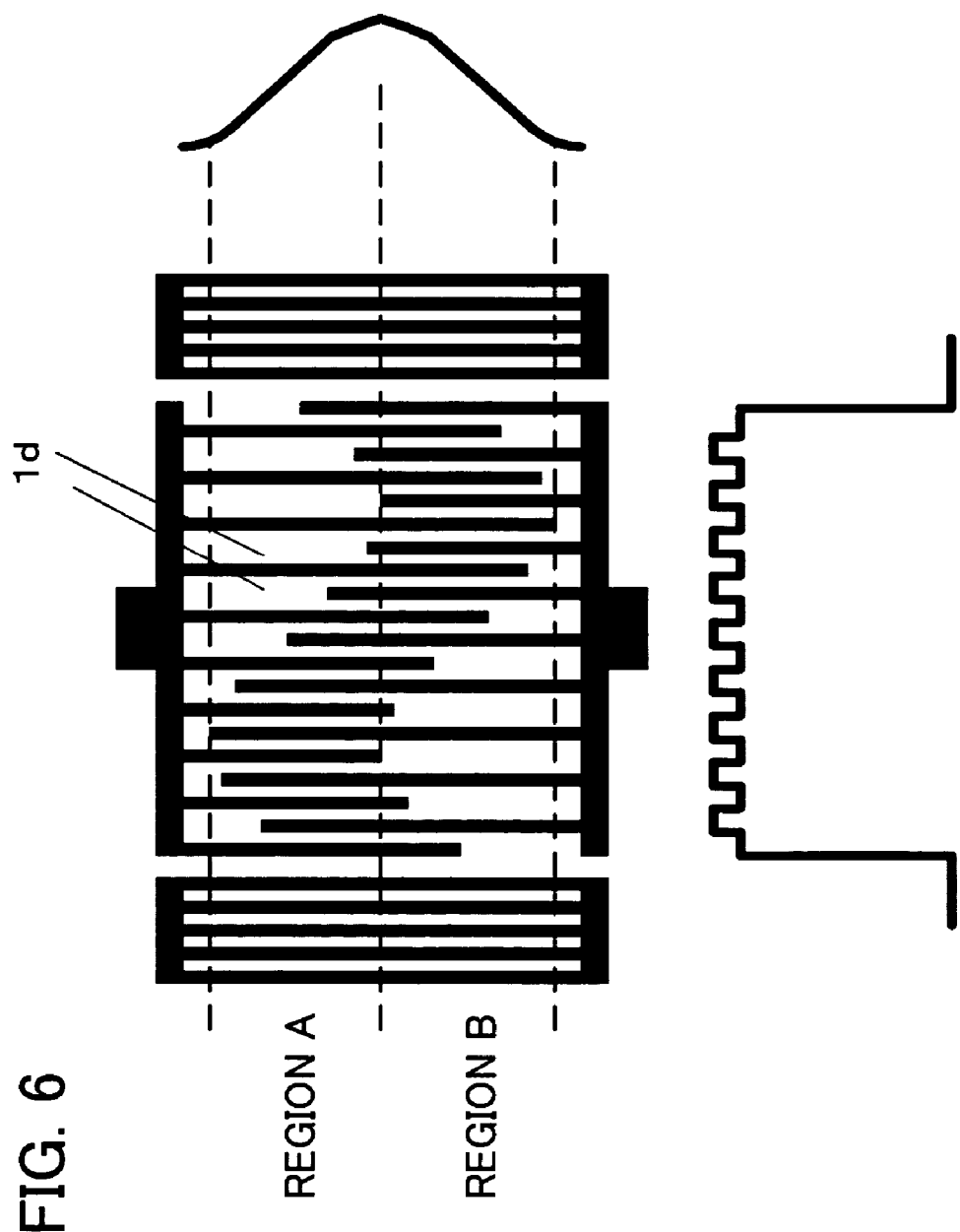
FIG. 6 is a diagram showing an example that the common electrodes do not have dummy electrodes and are set to have gaps.

Although the bus bars 1a, 1b are generally provided with dummy electrodes (e.g., 200, 201, etc. of FIG. 3) which do not contribute to the excitation of the surface acoustic wave, even if the dummy electrodes are not provided in the overlapping regions A and B as shown in embodiments of FIG. 5 and FIG. 6, the effect can be similarly achieved for suppressing the higher-order transverse modes.

In FIG. 5, the common electrodes 1a, 1b do not have the dummy electrodes and the common electrodes 1a, 1b itself are set to have a solid pattern shape corresponding to weighting of the overlapping amounts of the comb-shaped electrodes 1c in the overlapping regions A and B.

FIG. 6 is an example that the common electrodes 1a, 1b do not have the dummy electrodes and are set to have gaps 1d.

Discussion will be made of changing patterns of the weighting in the overlapping regions A, B.

In FIGS. 7A and 7B, an overlapping-length weighting envelope curve 21 in the second overlapping regions B has a shape mirror-symmetrical to an overlapping-length weighting envelope curve 20 in the first overlapping region A relative to an axis of the propagation direction of the surface acoustic wave and, in this example, minimum peaks and maximum peaks are generated in the distribution of the overlapping-lengths along the propagation direction, as shown in FIG. 7B.

The pattern of the change in the weighting according to the invention does not limited to the mirror symmetry as shown in FIG. 7A. FIG. 8 is a diagram describing a relationship between an overlapping-length weighting envelope curve in the second overlapping region B and an overlapping-length weighting envelope curve in the first overlapping region A. The overlapping-length weighting envelope curve 21 in the second overlapping region B has a shape of the overlapping-length weighting envelope curve 20 in the first overlapping region A translated vertically to the propagation direction of the surface acoustic wave as well as translated in the propagation direction, as shown by arrows.

With such an envelope curve shape pattern, minimum peaks and maximum peaks are also generated as shown in FIG. 7B.

Figure 7:
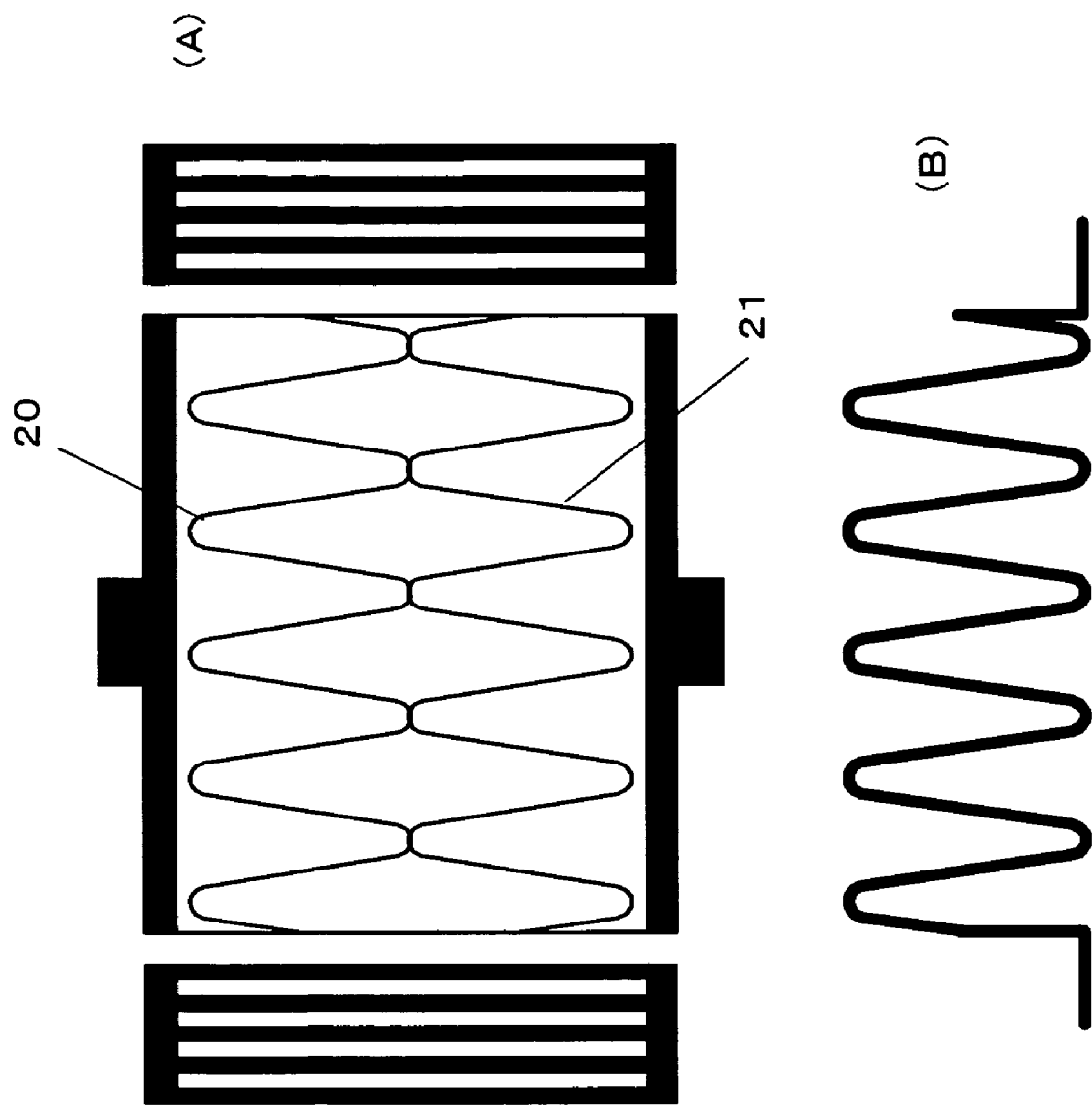
FIGS. 7A and 7B are diagrams showing an example generating minimum peaks and maximum peaks generated by the weighting in the weighted overlapping regions.
Figure 8:
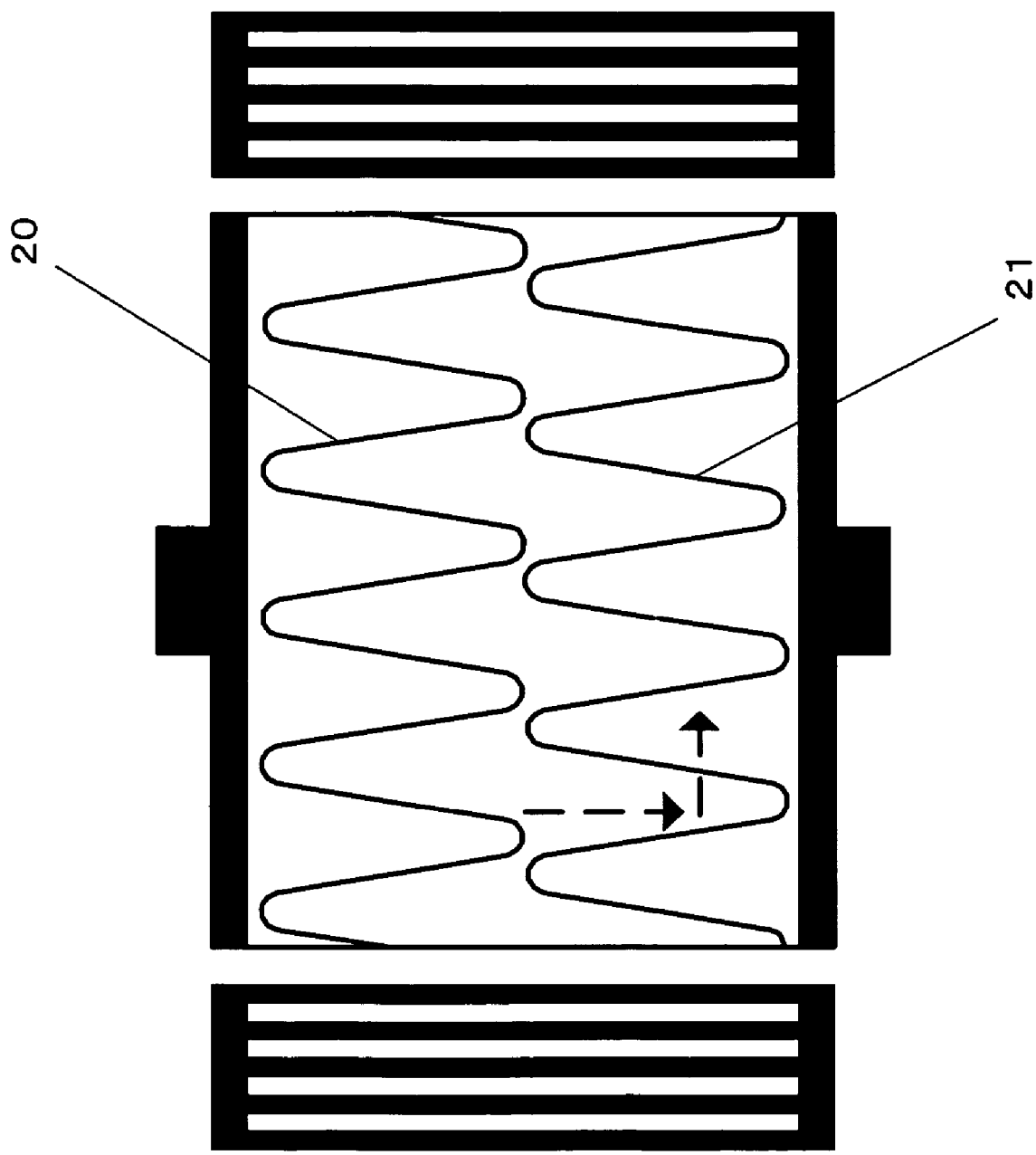
FIG. 8 is a diagram describing a relationship between an overlapping-length weighting envelope curve in the second overlapping region B and an overlapping-length weighting envelope curve in the first overlapping region A.

Although the repeating cycles of the overlapping-length weighting envelope curves 20, 21 are depicted longer for convenience in FIG. 7 and, in such a case, since unevenness is generated in the distribution of the overlapping-lengths along the propagation direction, the distribution does not approximated to a rectangular shape such as the distribution 11 of FIG. 3, the distribution of the overlapping-lengths along the propagation direction is approximated to a rectangular shape as the repeating cycles of the overlapping-length weighting becomes shorter and the same characteristics as the normal (non-apodized) IDT can be realized.

In the above embodiments, as a changing pattern of the weighting in the first and second overlapping regions A, B, an example has been shown which has been changed along the SIN curve shown in FIG. 3. However, the application of the invention is not limited to such embodiments.

Figure 9A:
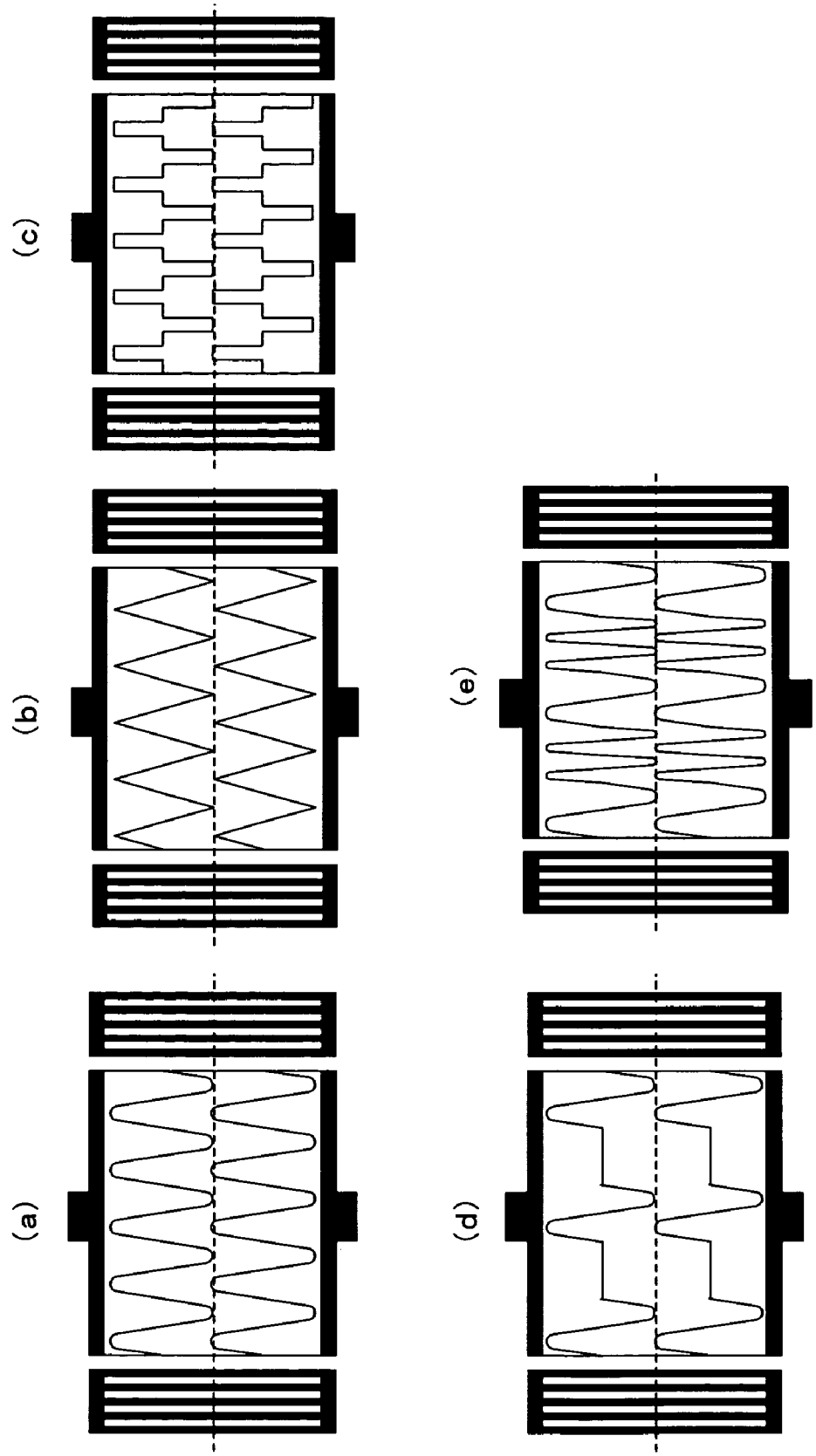
FIG. 9A is a diagram showing examples (Part 1) of various changing patterns of the weighting in the weighted overlapping regions as embodiments of the invention.
Figure 9B:
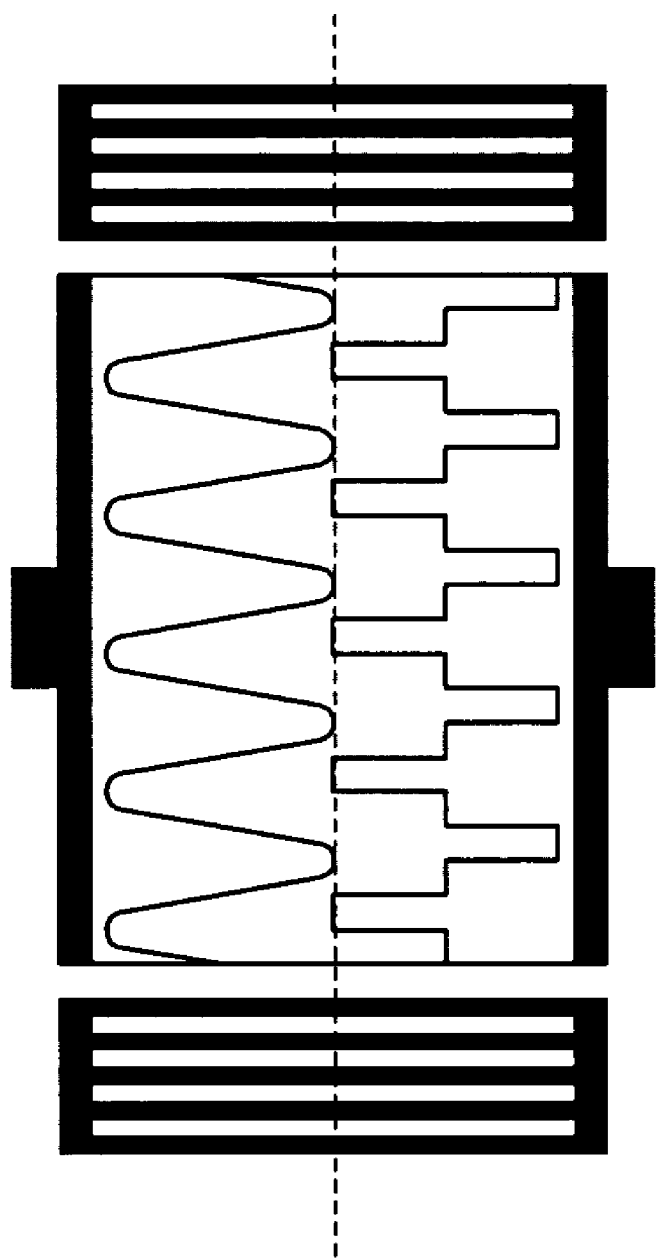
FIG. 9B is a diagram showing examples (Part 2) of various changing patterns of the weighting in the weighted overlapping regions as embodiments of the invention.
Figure 9C:
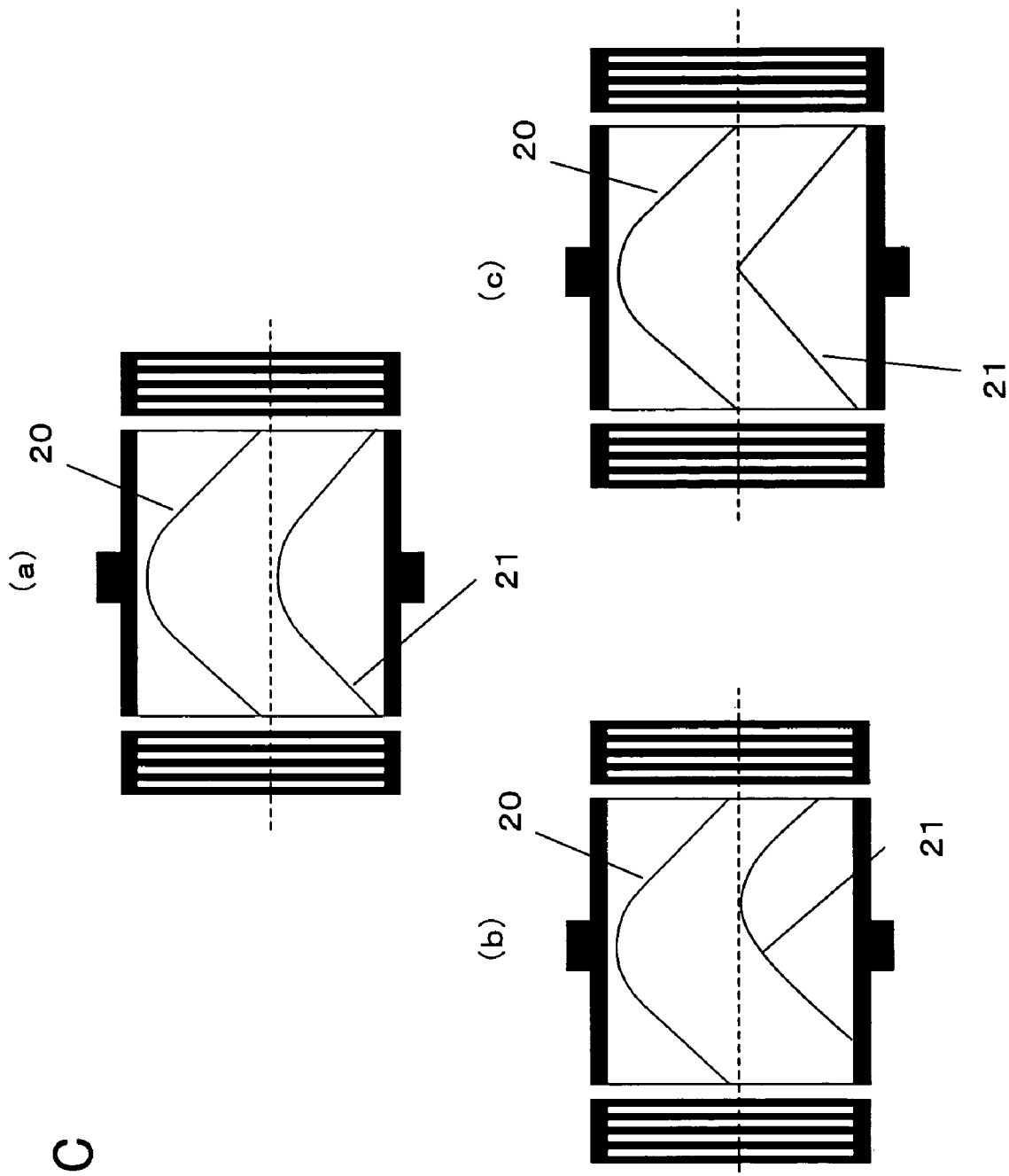
FIG. 9C is a diagram showing examples (Part 3) of various changing patterns of the weighting in the weighted overlapping regions as embodiments of the invention.

In FIGS. 9A, 9B and 9C, as embodiments of the invention (Part 1, Part 2, part 3), various examples of the weighting in the weighted overlapping regions A, B are shown as envelope curve patterns thereof.

In FIG. 9A, overlapping-length weighting envelope curves of (a) is a COS (or SIN) periodic function f(x) and the same as the embodiment shown in FIG. 3. This is an example of translating the first overlapping-length weighting envelope curve in the direction vertical to the propagation direction of the surface acoustic wave.

(b) is an example of representing the overlapping-length weighting envelope curve as a periodic function of a triangular wave. (c) is a periodic function alternating 1 and 0 values. (d) is an example of performing the weighting to a portion of the IDT, rather than the entire area thereof. (e) is an example of a combination of different functions. In such embodiments (b) to (e), a relationship between the first overlapping-length weighting envelope curve and the second overlapping-length weighting envelope curve is characterized by that the second overlapping-length weighting envelope curve has a shape of the first overlapping-length weighting envelope curve translated in the direction vertical to the propagation direction of the surface acoustic wave, as is the case with the embodiment (a).

With regard to the embodiments (a) to (e), as shown in FIG. 8, a shape pattern may be formed as the first overlapping-length weighting envelope curve translated in the direction vertical to the propagation direction of the surface acoustic wave as well as translated in the propagation direction of the surface acoustic wave.

An example shown in FIG. 9B is an example formed with a changing pattern of the weighting in the first overlapping region A and a different changing pattern of the weighting in the second overlapping region B. In such an example, since the distribution of the overlapping-lengths is approximated to a rectangular shape, the effect of the invention can be obtained as well.

The embodiments shown in FIGS. 9A and 9B are examples having two (2) or more changing points in the changing pattern of the weighting.

The invention is not limited to such a condition. In other words, examples of FIG. 9C are examples having only one (1) changing point in the changing pattern of the weighting. In FIG. 9C(a), a changing pattern 20 of the weighting envelope curve in the first overlapping region A has only one (1) changing point and a changing pattern 21 of the weighting envelope curve in the second overlapping region B is a shape pattern of the changing pattern 20 translated in the direction vertical to the propagation direction of the surface acoustic wave.

In FIG. 9C(b), a changing pattern 20 of the weighting envelope curve in the first overlapping region A has only one (1) changing point and a changing pattern 21 of the weighting envelope curve in the second overlapping region B is a shape pattern of the changing pattern 20 translated in the direction vertical to the propagation direction of the surface acoustic wave as well as translated in the propagation direction of the surface acoustic wave.

In FIG. 9C(c), changing patterns 20, 21 of the weighting envelope curves in the first and second overlapping regions A, B have only one (1) changing point. The overlapping-length weighting envelope curves have patterns different from each other. Even in the changing patterns 20, 21 of the weighting envelope curves in the first and second overlapping regions A, B shown in FIG. 9C which have only one (1) changing point, since the overlapping-length weighting envelope curves are not mirror symmetry relative to an axis of the propagation direction of the surface acoustic wave unlike the case of the conventional configuration (e.g., FIG. 2), the effect can be obtained which is generated because the distribution of the overlapping-lengths is an almost rectangular shape along the propagation direction.

Although each of the above embodiments shows the case that each of the weighted overlapping regions A, B is 50% of the aperture length of the interdigital transducer (IDT) 1, the application of the invention is not limited to such a case.

Figure 10:
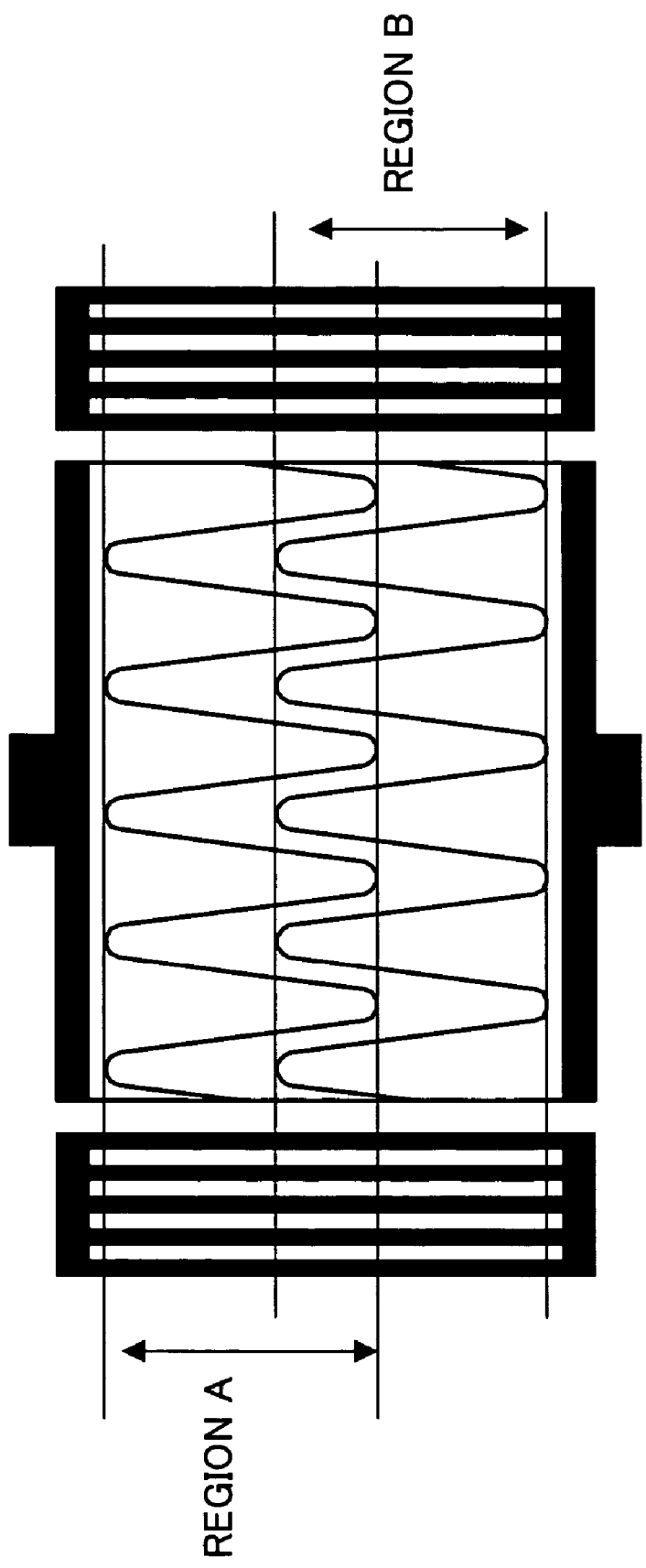
FIG. 10 is a diagram describing positions of the weighted overlapping regions A, B from a relationship with the aperture length of the interdigital transducer.

An example shown in FIG. 10 is the case that at least one of the weighted overlapping regions A, B is greater than 50% of the aperture length of the IDT 1. Although a loss is aggravated as the overlapping amount between the weighted overlapping regions A, B is increased, the same effect can be obtained from a viewpoint of the suppressing of the transverse-mode spurious.

In any case of such weighting, the requirements of the invention are satisfied and the effect of the invention can be obtained.

Figure 11A:
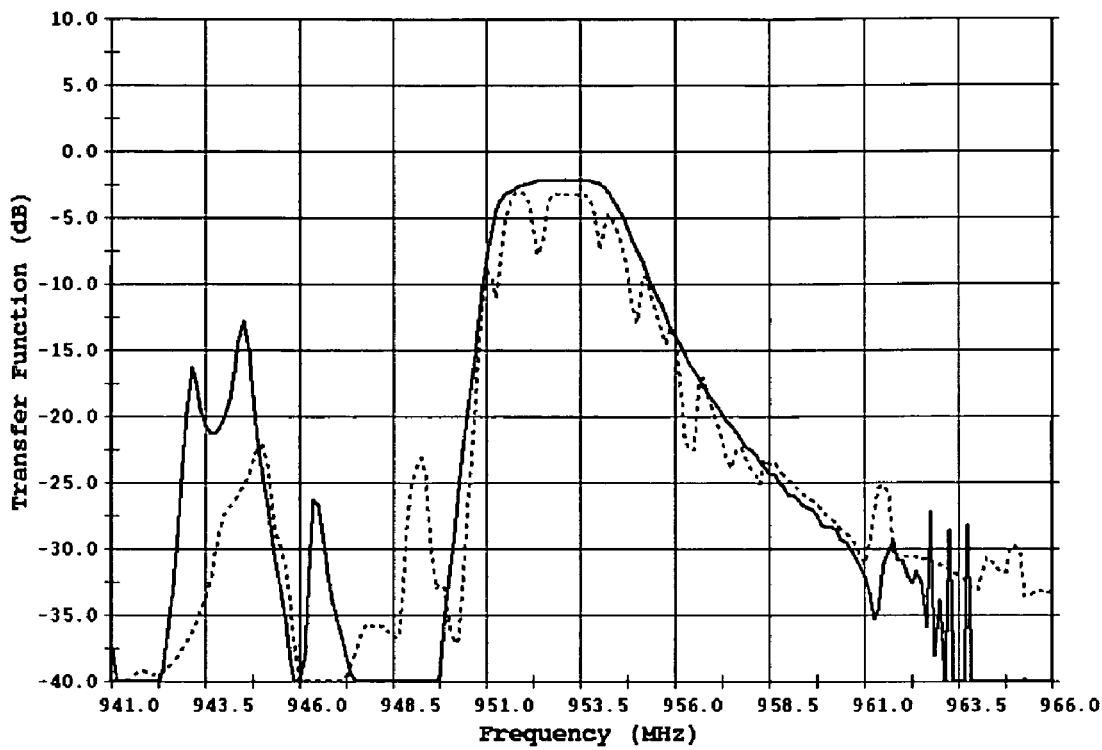
FIG. 11A is a diagram showing a characteristic of a 3IDT resonator filter manufactured experimentally on a $Li_2B_4O_7$ substrate.
Figure 11B:
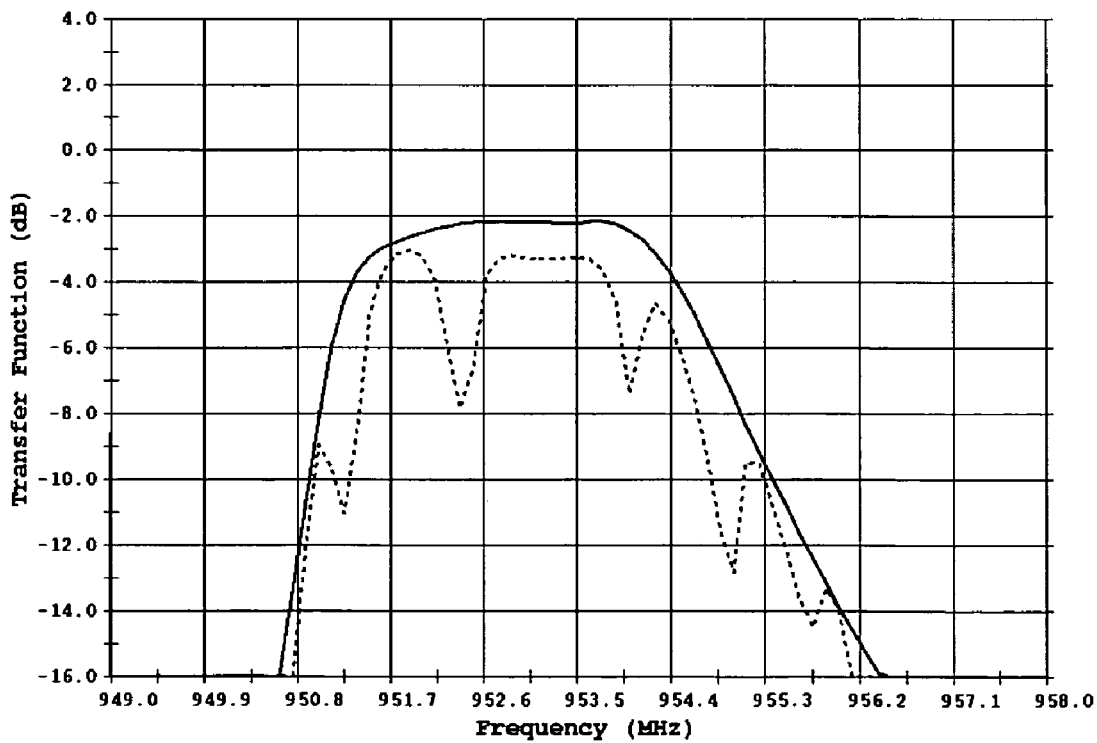
FIG. 11B is an enlarged view of the inside of the band of FIG. 11A.

FIG. 11A shows a characteristic of a 3IDT resonator filter manufactured experimentally on a $Li_2B_4O_7$ substrate. FIG. 11B is an enlarged view of the inside of the band of FIG. 11A. In the figures, a dashed line is a characteristic of the normal (non-apodized) IDT and a solid line is a characteristic in the case of applying the invention.

A COS function is used for the weighting and the 3IDT resonator filter is weighted as shown in FIG. 3. Although compensation is performed with a matching circuit in order to obtain impedance equivalent to the case of the normal (non-apodized) IDT since impedance is changed by the weighting of the IDT, the spurious can be suppressed and a bandwidth and an out-of-band damping characteristic can be achieved as is the case with the normal (non-apodized) IDT.

As set forth hereinabove, according to the invention, transverse-mode spurious can be suppressed and characteristics can be achieved which are the same as normal (non-apodized) electrodes. In this way, a SAW resonator and a SAW resonator filter can be designed which have a high degree of freedom and excellent characteristics.

What is claimed is:

1. A surface acoustic wave apparatus comprising at least one interdigital transducer, the interdigital transducer disposed such that a plurality of comb-shaped electrodes respectively connected to a pair of common electrodes are interleaved; and a pair of reflectors, respectively provided at the both sides of the interdigital transducer, wherein a region with the plurality of interleaved comb-shaped electrodes is formed with two regions which are a first overlapping region and a second overlapping region with overlapping-lengths weighted along a propagation direction of a surface acoustic wave, wherein the first overlapping region and the second overlapping region are in contact or overlapped in a direction vertical to the propagation direction of the surface acoustic wave, wherein in either the first or the second overlapping region, an overlapping-length weighting envelope curve is formed so as to have at least two or more changing points, in the propagation direction of the surface acoustic wave, at which points the overlapping-lengths weighting envelope curve changes from being increasing to decreasing or from being decreasing to increasing, and wherein patterns of the envelope curves of the first and second overlapping regions are identical.

2. The surface acoustic wave apparatus according to claim 1, wherein the overlapping-length weighting envelope curve in the second overlapping region has a shape of an overlapping-length weighting envelope curve in the first overlapping region translated vertically to the propagation direction of the surface acoustic wave.

3. The surface acoustic wave apparatus according to claim 1, wherein the overlapping-length weighting envelope curve in the second overlapping region has a shape of an overlapping-length weighting envelope curve in the first overlapping region translated vertically to the propagation direction of the surface acoustic wave as well as translated in the propagation direction.

4. The surface acoustic wave apparatus according to claim 1, wherein the overlapping-length weighting envelope curve in the second overlapping region has a shape which is mirror-symmetrical to an overlapping-length weighting envelope curve in the first overlapping region relative to an axis of the propagation direction of the surface acoustic wave.

5. The surface acoustic wave apparatus according to claim 1, wherein the overlapping-length weighting envelope curve in the second overlapping region has a shape which is mirror-symmetrical to an overlapping-length weighting envelope curve in the first overlapping region relative to an axis of the propagation direction of the surface acoustic wave and which is translated in the propagation direction.

6. The surface acoustic wave apparatus according to claim 1, wherein the common electrodes have a shape corresponding to the overlapping-length weighting envelope curves in the first and second overlapping regions.

7. A surface acoustic wave apparatus comprising:

at least one interdigital transducer, the interdigital transducer disposed such that a plurality of comb-shaped electrodes respectively connected to a pair of common electrodes are interleaved, and a pair of reflectors, respectively provided at the both sides of the interdigital transducer, wherein a region with the plurality of interleaved comb-shaped electrodes is formed with two regions which are a first overlapping region and a second overlapping region with overlapping-lengths weighted along the propagation direction of the surface acoustic wave, wherein the first overlapping region and the second overlapping region are in contact or overlapped in a direction vertical to the propagation direction of the surface acoustic wave, wherein each of overlapping-length weighting envelope curves in the first and the second overlapping regions is formed so as to have only one changing point, in the propagation direction of the surface acoustic wave, at which point the overlapping-lengths weighting envelope curves changes from being increasing to decreasing or changes from being decreasing to increasing, and wherein the changing points of overlapping-length weighting envelope curves in the first and the second overlapping regions change in the same direction in the propagation direction of the surface acoustic wave.

8. The surface acoustic wave apparatus according to claim 7, wherein the common electrodes have a shape corresponding to the overlapping-length weighting envelope curves in the first and second overlapping regions.

9. The surface acoustic wave apparatus according to claim 7, wherein the overlapping-length weighting envelope curve in the second overlapping region has a shape of an overlapping-length weighting envelope curve in the first overlapping region translated vertically to the propagation direction of the surface acoustic wave.

10. The surface acoustic wave apparatus according to claim 7, wherein the overlapping-length weighting envelope curve in the second overlapping region has a shape of an overlapping-length weighting envelope curve in the first overlapping region translated vertically to the propagation direction of the surface acoustic wave as well as translated in the propagation direction.

11. The surface acoustic wave apparatus according to claim 7, wherein the overlapping-length weighting envelope curve in the first overlapping region and the overlapping-length weighting envelope curve in the second overlapping region have shapes different from each other.

12. A surface acoustic wave apparatus comprising:

at least one interdigital transducer, the interdigital transducer disposed such that a plurality of comb-shaped electrodes respectively connected to a pair of common electrodes are interleaved; and a pair of reflectors, respectively provided at the both sides of the interdigital transducer, wherein a region with the plurality of interleaved comb-shaped electrodes is formed with two regions which are a first overlapping region and a second overlapping region with overlapping-lengths weighted along a propagation direction of a surface acoustic wave, wherein the first overlapping region and the second overlapping region are in contact or overlapped in a direction vertical to the propagation direction of the surface acoustic wave, wherein in either the first or the second overlapping region, an overlapping-length weighting envelope curve is formed so as to have at least two or more changing points, in the propagation direction of the surface acoustic wave, at which points the overlapping-lengths weighting envelope curve changes from being increasing to decreasing or from being decreasing to increasing, and wherein patterns of the envelope curves of the first and second overlapping regions are identical, and wherein the overlapping-length weighting envelope curve of either the first or the second overlapping region forms a shape represented by a periodic function $f(x)$, assuming that the propagation direction of the surface acoustic wave is a variable x.

13. The surface acoustic wave apparatus according to claim 12, wherein the overlapping-length weighting envelope curve in the second overlapping region has a shape of an overlapping-length weighting envelope curve in the first overlapping region translated vertically to the propagation direction of the surface acoustic wave.

14. The surface acoustic wave apparatus according to claim 12, wherein the overlapping-length weighting envelope curve in the second overlapping region has a shape of an overlapping-length weighting envelope curve in the first overlapping region translated vertically to the propagation direction of the surface acoustic wave as well as translated in the propagation direction.

15. The surface acoustic wave apparatus according to claim 12, wherein the overlapping-length weighting envelope curve in the second overlapping region has a shape which is mirror-symmetrical to an overlapping-length weighting envelope curve in the first overlapping region relative to an axis of the propagation direction of the surface acoustic wave.

16. The surface acoustic wave apparatus according to claim 12, wherein the overlapping-length weighting envelope curve in the second overlapping region has a shape which is mirror-symmetrical to an overlapping-length weighting envelope curve in the first overlapping region relative to an axis of the propagation direction of the surface acoustic wave and which is translated in the propagation direction.

17. The surface acoustic wave apparatus according to claim 12, wherein the common electrodes have a shape corresponding to the overlapping-length weighting envelope curves in the first and second overlapping regions.

* * * * *